United States Patent [19]

Falckenberg et al.

[11] Patent Number: 4,599,245
[45] Date of Patent: Jul. 8, 1986

[54] METHOD FOR MAKING LARGE-SURFACE SILICON CRYSTAL BODIES

[75] Inventors: Richard Falckenberg, Wald; Christa Grabmaier; Josef Grabmaier, both of Berg, all of Fed. Rep. of Germany

[73] Assignee: Siemens Aktiengesellschaft, Berlin & Munich, Fed. Rep. of Germany

[21] Appl. No.: 649,311

[22] Filed: Sep. 11, 1984

[30] Foreign Application Priority Data

Oct. 21, 1983 [DE] Fed. Rep. of Germany ....... 3338335

[51] Int. Cl.⁴ .................... B05D 3/02; B05D 5/12; H01L 31/00
[52] U.S. Cl. ..................... 427/74; 118/718; 118/725; 136/258; 156/607; 156/DIG. 84; 156/DIG. 88; 422/254; 427/86; 427/374.3
[58] Field of Search ............... 118/718, 725; 156/607, 156/DIG. 84, DIG. 88; 422/254; 427/74, 86, 374.3; 136/258

[56] References Cited

U.S. PATENT DOCUMENTS

| 4,305,776 | 12/1981 | Grabmaier .......................... 156/605 |
| 4,330,358 | 11/1982 | Grabmaier et al. ................. 156/603 |
| 4,357,200 | 11/1982 | Grabmaier .......................... 156/603 |
| 4,357,201 | 11/1982 | Grabmaier et al. ................. 156/603 |

FOREIGN PATENT DOCUMENTS

83P1090  6/1982  Fed. Rep. of Germany .

*Primary Examiner*—Michael R. Lusignan
*Attorney, Agent, or Firm*—Hill, Van Santen, Steadman & Simpson

[57] ABSTRACT

Starting plate-like silicon bodies matched to the dimensions desired in a product silicon crystal bodies are melted and then crystallized on a horizontal carrier member having a net structure using a heater arrangement. The carrier member is substantially not wettable by molten silicon and preferably consists of a quartz glass fiber fabric and is removable after the crystallization. The method is useful for the manufacture of silicon for solar cells and prevents contaminants from the carrier member from being incorporated into the product silicon crystal body and thereby deteriorating the electrical properties of the solar cells.

18 Claims, 3 Drawing Figures

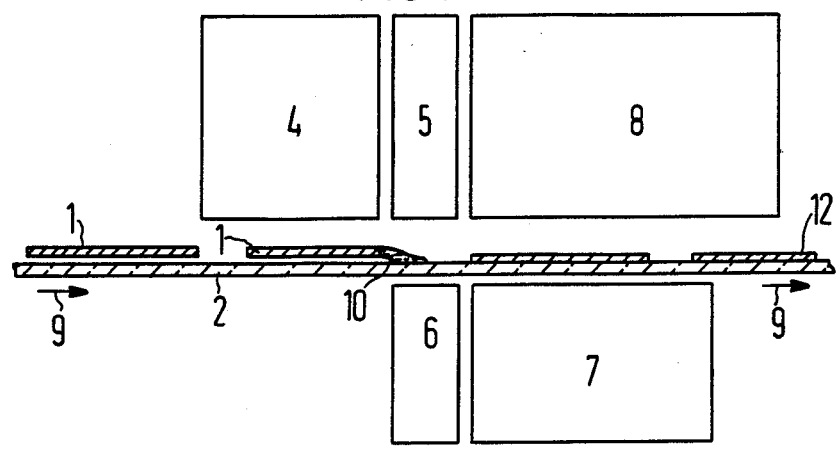
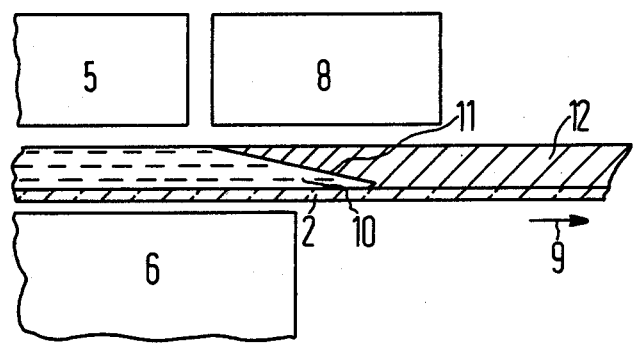
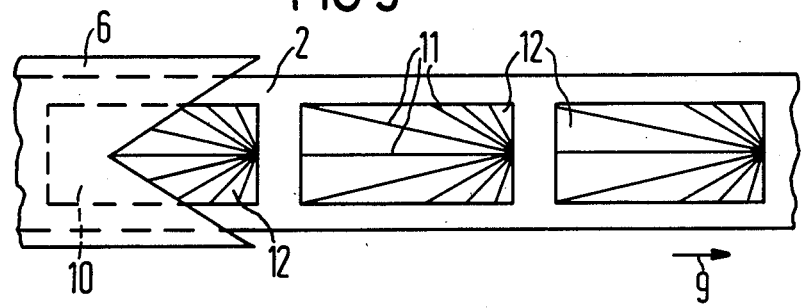

METHOD FOR MAKING LARGE-SURFACE SILICON CRYSTAL BODIES

RELATED APPLICATION

This application is related to our corresponding U.S. patent application Ser. No. 629,677 filed July 11, 1984, now abandoned, the disclosure and contents of which are incorporated herein by reference.

BACKGROUND OF THE INVENTION

1. Field of the Invention:

This invention lies in the field of manufacturing large-surface area silicon crystal bodies for use in solar cells.

2. Prior Art:

A method involving crystallizing molten silicon in a carrier net was proposed in the German patent application P No. 33 05 933.0. In this method, a horizontal carrier member consisting of a net-like graphite fabric and bearing sintered silicon bodies generally matched to the dimensions of the carrier member is moved through a heater arrangement, whereby the sintered silicon bodies disposed above the carrier member are caused to melt and the molten silicon is caused to crystallize in the meshes of the carrier member. The method serves for the continuous manufacture of silicon tapes for solar cells.

A problem occurs in the practice of this method because contaminants which can exist in the silicon network diffuse into the silicon crystal lattice as a consequence of the incorporation of the graphite net into the silicon, and these contaminants deteriorate the crystal quality as well as the electrical properties of the solar cells fabricated with the resulting silicon crystal bodies.

BRIEF SUMMARY OF THE INVENTION

The invention relates to an improved method for the manufacture of large-surface area polycrystalline silicon bodies for use in solar cells, wherein silicon bodies having low crystal grain size, preferably sintered silicon plate-like bodies, which are approximately matched to the desired dimensions of the product silicon crystal bodies, are employed as the starting material, and wherein these starting bodies are caused to melt and subsequently to crystallize on a horizontally disposed net-like carrier member. The carrier member is resistant to molten silicon and is substantially not wettable by molten silicon.

An object of the present invention is to provide an improved method wherein the above directed disadvantages are eliminated.

Such object is achieved by utilizing a method of the type initially cited but with the improvements that the carrier net employed is substantially not wettable (e.g. is only slightly wettable) by molten silicon. This improved carrier net preferably consists of quartz and preferably is in the form of a woven fabric consisting of quartz thread or fiber.

It lies within the teachings of the present invention to employ a heater arrangement which utilizes a plurality of separately controllable heating zones, whereby a pre-heating of the starting silicon bodies is preferably undertaken before the melting thereof, and a post-melting treatment involving simultaneous localized heating and localized cooling of molten and crystallizing silicon is also preferably undertaken. The pre-heating, which is applied only on one side, is meant to prevent the carrier member consisting, for example, of a quartz glass fiber fabric, from reaching and remaining at a high temperature for an unnecessarily long time and thus giving rise to the danger of an incorporation of components derived from the carrier into the crystallized silicon. A desired direction solidification of the silicon melt is promoted by means of an after-heating from below with simultaneous cooling from above. The thickness of the silicon melt film to be achieved on the fabric is influenced by the thickness of the individual starting sintered silicon bodies.

Other and further objects, aims, purposes, features, advantages, variations, achievements, aspects and the like will be apparent to those skilled in the art from the teachings of the present specifications taken with accompanying drawings and claims.

BRIEF DESCRIPTION OF DRAWINGS

The method according to the teaching of the invention shall be explained in yet greater detail below with reference to exemplary embodiments and FIGS. 1 through 3.

In the drawings

FIG. 1 is a schematic side elevational view of a heater arrangement used in apparatus employed in the practice of the present invention;

FIG. 2 is a schematic detailed view in side elevation of the melting and the crystallizing zones producable by the apparatus shown in FIG. 1; and FIG. 3 is a schematic detailed plan view showing a modification of the arrangement illustrated in FIGS. 1 and 2 wherein a lower heater 6 in the melting zone is adapted to produce graduated but symmetrical heating from the longitudinal center of a silicon plate or body proceeding forwardly (relative to the direction of movement of the carrier) and laterally to the opposing sides thereof so that heat applied to such center region determines first while heat applied to such opposing sides determines last as the carrier moves through the heating and melting zone.

DETAILED DESCRIPTION

The present invention in commercial practice is preferably practiced continuously, although batch operations are possible. Continuous operation is exemplified in the drawings and associated text herein below. An illustration of the transport mechanism effecting the movement of the carrier member has been omitted in the apparatus shown in FIGS. 1 through 3 since it is not essential to the invention. Identical parts are provided with the same reference characters in all Figures.

Referring to FIG. 1, there is seen a plurality of flat silicon bodies 1 which each consists of sintered or tape-sprayed silicon bodies 1 which are sequentially arranged upon a ribbon carrier 2 of net or woven fiber. The bodies 1 are placed upon the horizontal carrier 2 from a magazine tray (not detailed). The net-like carrier 2 can, for example, consist of woven quartz glass or mullite ($3Al_2O_3 \cdot 2 SiO_2$) fibers. In general, the netlike carrier structure is resistant to molten silicon and is substantially not wettable by molten silicon. The silicon bodies in general each have (a) dimensions which approximate those, less anticipated shrinkage from melting during processing as taught herein, of the desired product silicon crystal bodies, and (b) dimensions which are generally larger than the average individual mesh size existing in the net like carrier structure. The assembly of carrier 2 with silicon bodies 1 resting thereon is moved continuously and horizontally through a heater arrangement which incorporates, for example, heaters 4, 5 and 6. In the heater arrangement, the silicon is caused to melt in zone (10) on the carrier 2. An encapsulation of the fibers of the carrier 2 by the molten silicon in the melt zone 10 cannot occur because of their poor wettability by molten silicon. A pre-heating by furnace 4 (length about 20 cm) of the surfaces of the silicon plates 1 ensues before the melting of such bodies 1. Heat for melting is provided by the melting furnaces 5 and 6 which are in opposed relationship to one another (lenght about 5 cm). The arrows 9 indicate the direction of continuous movement by carrier 2. The conveying speed is set, for example, at a value of about 50 cm/min. The pre-heat conveniently carried out at an average temperature of about 1200° C. using presintered silicon plates 1 while the melting is carried out conveniently at a temperature ranging from about 1000° C. to 1400° C. applied preferably from below.

A post-melting heat treatment by furnace 7 is (length about 20 cm) effectuated after passage through the melting zone 10. The crystallization of the molten silicon on the carrier member 2 in a zone 11 is promoted by means of a cooling apparatus 8 which is located in opposed relationship to furnace 7.

The crystallized silicon plate can be simply lifted off from the quartz glass fiber fabric 2 after cooling.

Since the carrier 2 employs fibers of quartz glass, mullite or the like which can become soft after a short time at the melting temperature of the silicon and which can deform at such temperature under the pressure of the silicon resting thereon, it is advantageous not to conduct the carrier 2 in an unsupported manner through the heater arrangement. It is preferred to employ a graphite plate, a graphite fiber net, or a graphite film or other suitable graphite surface as a conveying means and supporting surface for the carrier 2. After the molten silicon crystallization, the resulting silicon plates 12 and adhering carrier 2 are lifted off from the conveying means and the carrier 2 is separated from the resulting silicon crystal plates 12. The carrier 2 is stripped from silicon plates 12 by using, for example, a scraper (not shown) which is integrated into the processing system. The carrier 2 can be reemployed in the practice of the process of this invention.

In FIG. 2 is shown the detail of the transition from the melting zone 10 into the crystallized silicon plates 12. The same reference characters apply as in FIG. 1. The post-melting, heat treating furnace 7 as well as the pre-heating furnace 4 are not shown in the drawing. The crystallization front or zone is referenced by numeral 11.

In FIG. 3 a plan view is presented showing a modification of the FIG. 2 embodiment which modification is particularly well suited for the manufacture of especially large-grained, polycrystalline silicon plates 12. Here, the heater 6 is shaped that, as the crystallization of the silicon plates 12 occurs, the crystallization progresses from a longitudinal center region of each plate forwardly towards the opposed outside lateral edges. This effect can be achieved by a wedge-shaped incision or area defined in the heater 6, for example, or it can be achieved by selectively cladding the heater 6 with a cooling plate or such an area can be achieved by selectively applying a cooling gas against the crystallizing plates 12. The number of initial nucleation centers is thereby reduced; the few grains arising become larger. Thus, crystal size in plates 12 is maximized.

Suitable base materials for use in a net structure employable as a carrier 2 which are not wet with molten silicon include, in addition to the preferred quartz glass fibers, in particular, temperature-stable graphic thread fabrics that are coated with $SiO_2$ and fabrics formed of leached silica glass fibers which only consist of an $SiO_x$ skeleton after the leaching (where $x$ is number typically greater than 2). The latter fibers are extremely pure and can be manufactured in a very cost-favorable fashion, as those skilled in the art will appreciate.

Preferably, the net like carrier 2 has a structure wherein the average mesh size ranges, in an individual carrier 2, from about 10 to 100mm$^2$ although larger and smaller average mesh size can be used. Preferably, each starting silicon body 1 has a plate cross sectional area which is at least equal to twice the average mesh size of the carrier 2 being used in any given instance. More preferably, each silicon body 1 has a plate cross-sectional area which ranges from about 4 to 10 times the average mesh size of the carrier being used. The perimeter configuration of an individual mesh can be as desired, consistent with weaving considerations or the like.

The employment of fabrics for a carrier 2 that are not moistened by a silicon melt in accord with the present invention yields the following advantages:
1. Low substrate costs due to cheap manufacture and the reemployability of the substrate carrier 2.
2. Low contamination of the arising silicon bodies 12 due to the composition of the carrier 2.
3. High crystal quality of the silicon bodies 12.

It may be anticipated that solar cell efficiencies of around 12% can be achieved with such silicon bodies 12. Inexpensive silicon starting material can be utilized for making bodies 1. Silicon bodies 1 can, for example, be cost-favorably manufactured with large dimensions in the form of sintered silicon particles comprised of tape-sprayed silicon or the like.

The manufacture of silicon bodies consisting of sintered silicon particles expediently ensues according to a method disclosed in the German OS No. 29 27 086. The raw material is silicon powder. A film is first produced, and this is cut to dimensions which, taking the shrinkage during sintering into consideration, correspond to the dimensions of a desired solar cell, for example, about 10 cm×10cm (100cm$^2$). A pre-sintering of such a film leads to self-supporting plates and can be conveniently accomplished at temperatures ranging from about 1250° C. to 1350° C. with the resulting plates being stacked ready for use in the process of the present invention. Since a self-supporting, compressed silicon plate can be utilized, the temperature management is thereby of subordinate significance. It has been shown that the pre-sintering can even be omitted when, for example, a resistance furnace is employed in which the heating of the silicon film occurs in an atmosphere initially containing oxygen in order to burn off the organic bonding agent.

The sintered plates, or alternatively, the raw sheets, can be stacked in trays. A carrier member composed of quartz glass fibers passing by therebelow can thus be continuously supplied with such silicon plates 1, or supplied therewith at desired intervals (as shown in, for example, FIGS. 1 and 3).

Pre-sintering and melting of silicon plates 1 can advantageously be executed in a vacuum, or alternatively, in an argon atmosphere.

Since an inexpensive silicon starting material can be utilized in the manufacture of silicon plates 12 made according to the teachings of the present invention, a great decrease in the cost of solar cells is achievable.

The silicon plates 12 manufactured according to the invention can also be advantageously employed as very cost-beneficial silicon substrate material for the manufacture of semiconductor components.

Although modifications and changes may be suggested by those skilled in the art it is the intention of the inventor to embody within the patent warranted hereon all changes and modifications as reasonably and properly come within the scope of their contribution to the art.

We claim:

1. A method for manufacture of large-area silicon crystal bodies adapted for further processing into solar cells, comprising the sequential steps of:
   (a) depositing on surface portions of a horizontally oriented, net-like structure preformed silicon bodies having a plate-like form, said net-like structure being
      (a) resistant to molten silicon, and
      (b) substantailly not wettable by molten silicon, said silicon bodies each having
         (1) dimensions which approximate those, less anticipated shrinkage from melting, of the desired product silicon crystal bodies, and
         (2) dimensions which are generally larger than the average individual mesh size existing in said netlike structure.
   (b) heating the resulting assembly of said net-like structure with said silicon bodies deposited thereon to a temperature sufficient to melt said silicon, and
   (c) crystallizing the so-melted silicon on said net-like structure to produce said silicon crystal bodies.

2. The process of claim 1 wherein said net-like structure is comprised of a fabric formed of fibers selected from the group consisting of:
   (a) quartz,
   (b) mullite,
   (c) graphite coated with $SiO_2$, and
   (d) leached silica glass.

3. The process of claim 2 wherein said net-like structure is a fabric consisting of quartz fibers.

4. The process of claim 1 wherein said net-like structure is characterized by having an average mesh size in the range from about 10 to 100mm$^2$.

5. The process of claim 4 wherein each said silicon body has a plate cross sectional area which is at least equal to twice said average mesh size.

6. The process of claim 4 wherein each said silicon body has a plate cross-sectional area which ranges from about 4 to 10 times said average mesh size.

7. The process of claim 1 whereinafter said crystallizing, said silicon crystal bodies are stripped from said net-like structure.

8. The process of claim 1 wherein said steps are practiced continuously.

9. The process of claim 1 wherein said net-like structure is in the form of a ribbon.

10. The process of claim 1 wherein said silicon bodies are produced by preliminarily sintering silicon powder.

11. The process of claim 1 wherein said silicon bodies are produced by spraying molten silicon onto a cooled drum.

12. The method of claim 1 wherein said heating is conducted progressively in a heating zone, and said heating zone includes a plurality of successive subzones, a first of said subzones being a silicon preheating zone, and a second of said subzones being a silicon melting zone, and wherein, in said first subzone, said silicon flat bodies are heated from above only, and wherein, after said second subzone, such resulting composite is subject to said crystallizing, and wherein, during said crystallizing, such composite is simultaneously heated from below and cooled from above.

13. A continuous process for making polycrystalline large-area silicon bodies adapted for processing into solar cells comprising in combination:
   (a) continuously moving a ribbon having a net-like structure wherein individual mesh sizes range from about 10 to about 100mm$^2$ each and which ribbon is comprised of a fibrous material selected from the group consisting of quartz, mullite, graphite coated with $SiO_2$, and leached silica glass, said ribbon being horizontally oriented, said moving extending successively through each of:
      (1) a silicon loading zone,
      (2) a silicon heating zone, and
      (3) a silicon cooling zone,
   (b) in said loading zone, successively depositing along and upon said ribbon individual preformed plate-like silicon bodies in predetermined locations,
   (c) in said heating zone, successively first preheating said silicon forms from above and then heating the assembly of said silicon forms and said ribbon to a temperature sufficient to melt said silicon, and
   (d) in said cooling zone, crystallizing said molten silicon on said ribbon while simultaneously heating from below and cooling from above.

14. The process of claim 13 wherein said preheating is carried out at an average temperature of about 1200° C.

15. The process of claim 13 wherein said heating is carried out at a mean temperature of from about 1000° to 1400° C. applied from below.

16. The process of claim 13 wherein said heating is carried out so as to produce graduated but symmetrical heating from the longitudinal center of each silicon body proceeding laterally to the opposing sides thereof so that heat applied to such center region terminates first while heat applied to such opposing sides terminates last as said ribbon moves through said heating zone.

17. The process of claim 13 wherein said ribbon is conveyed through said zones in contact with a graphite support.

18. The process of claim 13 wherein said ribbon continuously moves at a speed of about 50 cm/min.

* * * * *